United States Patent [19]
Chang et al.

[11] Patent Number: 4,616,247
[45] Date of Patent: Oct. 7, 1986

[54] P-I-N AND AVALANCHE PHOTODIODES

[75] Inventors: Gee-Kung Chang; Adrian R. Hartman, both of New Providence; McDonald Robinson, Chester, all of N.J.

[73] Assignee: AT&T Bell Laboratories, Murray Hill, N.J.

[21] Appl. No.: 550,230

[22] Filed: Nov. 10, 1983

[51] Int. Cl.⁴ .................. H01L 27/14; H01L 31/00
[52] U.S. Cl. .................................... 357/30; 357/13; 357/58
[58] Field of Search ............. 357/13, 30, 30 A, 30 D, 357/30 F, 58, 63

[56] References Cited

U.S. PATENT DOCUMENTS

| | | | |
|---|---|---|---|
| 3,534,231 | 10/1970 | Biard | 357/30 |
| 4,079,405 | 3/1978 | Ohuchi et al. | 357/30 |
| 4,083,062 | 4/1978 | Ohuchi et al. | 357/13 |
| 4,127,932 | 12/1978 | Hartman et al. | 29/590 |
| 4,142,200 | 2/1979 | Mizushima et al. | 357/30 |
| 4,242,695 | 12/1980 | Ouchi et al. | 357/30 |
| 4,276,099 | 6/1981 | Keen et al. | 357/63 |

OTHER PUBLICATIONS

Kaneda et al., "Low Noise Avalanche Photo Diode by Channeling of 800-keV Boron into <110> Silicon", J. Appl. Physics, 49 (12) Dec. 1978, pp. 6199-6200.
Miller et al., "Double-Mesa Thin-Film Reach-Through Silicon Avalanche Photodiode with Large Gain-Bandwidth Product", International Electron, Devices Meeting, Dec. 6-8, 1976, pp. 416-419.
Kanbe et al., "Silicon Avalanche Photodiodes with Low Multiplication Noise and High-Speed Reponse", IEEE Transaction on Electron Devices, vol. Ed-23, No. 12, Dec. 1976, pp. 1337-1343.

Primary Examiner—James W. Davie
Assistant Examiner—Georgia Y. Epps
Attorney, Agent, or Firm—Wendy W. Koba

[57] ABSTRACT

High-speed p-i-n and avalanche photodetectors (photodiodes) use a heavily doped buried layer to greatly limit minority carriers generated by incident light in the buried layers and the substrates of the devices from reaching the cathodes and thus enhances response time while substantially decreasing dark current. A p-i-n diode of this type with a 1.1 square millimeter active area can operate with 4 volt reverse bias and is capable of having edge rise and fall times in the 4 nanosecond range.

15 Claims, 2 Drawing Figures

P-I-N AND AVALANCHE PHOTODIODES

TECHNICAL FIELD

This invention relates to photodiodes and more particularly to n+-π-p+ silicon photodiodes of the p-i-n type and to n+-p-π-p+ silicon avalanche photodiodes.

BACKGROUND OF THE INVENTION

One common type of photodiode, which is illustrated in FIG. 3 of U.S. Pat. No. 4,127,932, in which there is a common assignee with the present application and one common inventor, is a p-i-n type semiconductor photodiode with a p+ substrate which acts as the anode, a p− type epitaxial layer, and an n+ type surface region which acts as the cathode. In order to achieve high-speed operation with short response time, it is desirable to have a relatively thick epitaxial layer and a large enough reverse bias voltage to deplete the epitaxial layer such that essentially all light-induced electrons result in electron-hole pairs in the epitaxial layer, with the electrons relatively quickly exiting the epitaxial layer into the cathode, and the holes relatively quickly reaching the anode exiting the epitaxial layer into the substrate. Any electrons which are induced as a result of light which reaches the substrate must first relatively slowly diffuse into the epitaxial layer before they move relatively quickly to the cathode. This type of photodiode is typically operated with the magnitude of the reverse bias being sufficient to essentially completely deplete the epitaxial layer. As the thickness of the epitaxial layer is increased so as to enhance response time, the magnitude of the needed applied reverse bias voltage increases as the square of the thickness of the epitaxial layer. This requires in many applications a reverse bias potential of typically 30 volts or more for a p-i-n diode. Many of today's photodiodes operate with solid-state integrated circuits that use a 5 volt power supply. The requirement of a separate 30 volt supply places additional expense on the overall system, increases potential failure of lower voltage integrated circuits used with the photodiode, and thus is undesirable. Another problem with photodiodes is that the reverse bias leakage current with no light applied, the "dark current", limits operating ranges.

It is desirable to have a silicon p-i-n photodiode which operates with a supply voltage of typically 5 volts or less, can achieve high-speed operation with relatively short response time, and has a relatively small dark current. It is also desirable to have a silicon avalanche photodiode which can be operated in the 100 volt range, can achieve high-speed operation with short response time, and has a relatively small dark current.

SUMMARY OF THE INVENTION

The present invention is essentially directed to a p-i-n or avalanche type photodiode which uses a p++ type buried layer sandwiched between the conventional p− type epitaxial layer and the p+ type substrate. The p++ type buried layer limits slow diffusing minority carries generated in the substrate from reaching the depletion layer and thus facilitates short response time to light signals incident upon the photosensitive area of the photodiode.

Viewed from another aspect the invention is directed to a semiconductor photodiode having a semiconductor body (substrate) of a first conductivity type and being of relatively high impurity concentration. A first semiconductor layer (epitaxial layer) of the same conductivity type, but of relatively low impurity concentration, is over the semiconductor body and has formed therein a localized first semiconductor region (a cathode) of the opposite conductivity type and of relatively high impurity concentration. The first semiconductor region and the first semiconductor layer are in electrical contact and form a photosensitive semiconductor junction. The photodiode is characterized by a second semiconductor layer of the first conductivity type and of higher impurity concentration than that of the semiconductor body. The second semiconductor layer is sandwiched between the first semiconductor layer and the semiconductor body. Separate electrodes coupled to the semiconductor body and to the localized first region serve as the anode and cathode terminals.

In one embodiment the p-i-n photodiode having a photosensitive area of 1.1 square millimeters is designed to be responsive to a light source having a wavelength in the range of 0.8 to 0.9 microns and to operate at a reverse bias of 4 volts. Output signal rise and fall times of approximately 4 nanoseconds have been measured.

These and other features and advantages of the present invention are better understood from a consideration of the following detailed description taken in conjunction with the accompanying drawings.

DETAILED DESCRIPTION

Figure 1:
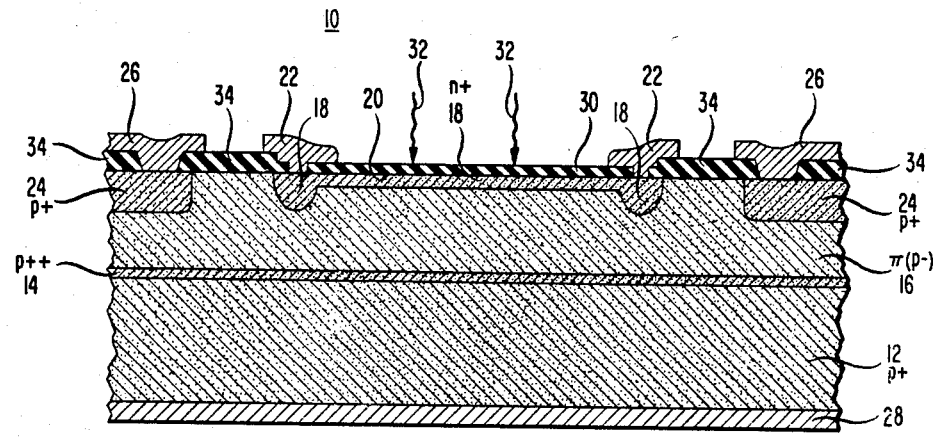
FIG. 1 is a cross-sectional view of a semiconductor photodiode structure in accordance with one embodiment of the present invention.

Referring now to FIG. 1, there is illustrated a semiconductor photodiode structure 10 in accordance with one embodiment of the present invention. Photodiode 10 comprises a semiconductor substrate 12 of one conductivity type and being of relatively high impurity concentration (heavily doped), a deep buried semiconductor layer 14 (which may be denoted as a minority carrier "killer layer") of the one conductivity type and being of higher impurity concentration than substrate 12, an epitaxial layer 16 of the one conductivity type and of relatively low impurity concentration (lightly doped), and a semiconductor region 18 of the opposite conductivity type and being of relatively high impurity concentration. A semiconductor region 24 encircles region 18 and is separated from same by portions of epitaxial layer 16. Separate electrodes 22, 26 and 28 are electrically coupled to region 18, region 24, and substrate 12, respectively. Portions of regions 24 and 18 and layer 16 share a common top surface 20 of photodiode 10. An anti-reflective layer 30 exists on a portion of surface 20 above portions of region 18. A dielectric layer 34 exists on portions of surface 20 and separates electrodes on surface 20. Light 32 is illustrated incident upon layer 30.

In one illustrative embodiment substrate 12, layer 14, layer 16, region 18, region 24, and layer 30 are of p+, p++, p−, n+, p+ type, and silicon nitride, respectively. Electrodes 22, 26, and 28 are aluminum. Region 24 is rectangular and acts as a guard ring. Region 18 is rectangular and acts as the cathode and substrate 12 acts as the anode. Photodiode 10 is typically operated in reverse bias with cathode region 18 held at a more positive voltage than anode substrate 12. It is to be appreciated that the conductivity types of each of the silicon elements can be reversed and region 18 and substrate 12 would then become the anode and cathode, respectively.

Incident light 32 on layer 30, which is essentially transparent, reaches a top surface of region 18 and causes charge carrier generation in region 18, layers 14 and 16 and substrate 12 which results in the generation within photodiode 10 of a photo-induced current. A substantial portion of layer 16 is typically depleted mostly vertically under region 18 by the applied reverse bias. Electrons generated in region 18 are quickly discharged through electrode 22 to a power supply or through circuitry which are both not illustrated. Electrons generated in layer 16 rapidly drift through depleted epitaxial layer 16 and rapidly pass through cathode 18 and exit through electrode 22. Electrons generated in layer 14 have a very short lifetime and therefore recombine very rapidly such that most of these electrons do not reach epitaxial layer 16 or electrode 22. Electrons generated in substrate 12 are repelled by the electrical field resulting from the high impurity concentration of layer 14 and thus never reach layer 16 or electrode 22. Holes generated in layers 14 and 16 and in substrate 12 rapidly move to electrode 28 and then out of structure 10 to circuitry or a power supply (both not illustrated) coupled to electrode 28. The central portion of region 18 is purposely kept thin such that few holes recombine there. As a direct result of layer 14, the response time of photodiode 10 is relatively fast since essentially all electrons generated in layer 14 and substrate 12 are recombined and do not slow up the response time. There is some loss of photo-induced current but same is not serious to the operation of photodiode 10.

Photodiode 10 has been fabricated using the following basic process. A clean p+ type silicon wafer is first oxidized in dry oxygen at 900° C. for 30 to 45 minutes to grow a 100 to 150 Angstrom thick silicon dioxide layer over the top surface. A p++ type layer is formed by an ion implant of boron through the oxide into the silicon at a dose of 1E16 cm$^{-2}$ with an energy level of 100 to 150 keV. The wafer is then cleaned and a 15:1 H$_2$O:HF solution is used for 2 minutes followed by a DI water rinse and a spin dry for 2 minutes. The wafer is then subjected to a vapor HCl etch for approximately 15 seconds at 1200° C. to remove approximately 500 Angstroms of silicon. An epitaxial layer is then formed using diborane gas and silicon tetrachloride gas at a temperature of 1150° C. with a deposition rate of approximately 2 microns of silicon per minute. Using standard semiconductor processing the n+ type cathode region and the p+ type guard region are then formed in the epitaxial layer. Metalization is then formed using standard semiconductor processing.

A photodiode 10, fabricated using the above-described process, has a substrate 12 which is approximately 400 microns thick and has an impurity concentration of approximately 10$^{17}$ to 10$^{18}$ impurities/cm$^3$, has a layer 14 which is approximately 5 microns thick and has an impurity concentration of approximately 10$^{19}$ to 10$^{20}$ impurities/cm$^3$, has an epitaxial layer 16 which is approximately 20 microns thick and has an impurity concentration 1 to 4.5×10$^{13}$ impurities/cm$^3$, has a rectangular cathode region 18 having an area of approximately 1.1 square millimeters and an impurity concentration of 10$^{19}$ to 10$^{20}$ impurities/cm$^3$ and having a central portion which is approximately 1 micron thick and having outer portions which are approximately 4 microns thick, and has a rectangular guard ring region 24 which is approximately 4 microns thick and has an impurity concentration of approximately 10$^{17}$ to 10$^{18}$ impurities/cm$^3$. The anti-reflective coating is essentially silicon nitride and all electrodes are of aluminum. The overall top surface area of photodiode 10 is approximately 2.2 square millimeters.

Reverse bias leakage with no light (known as dark current) applied to photodiode 10 is significantly reduced because layer 14 causes the minority carriers thermally generated in layer 14 and substrate 12 to recombine and thus they never reach cathode electrode 22. In addition, the electric field at the boundary of layer 14 and substrate 12 repels electrons back into the substrate and thus limits the number of electrons which reach layer 16. Measured dark current was found to be greater than one order of magnitude lower when layer 14 is used as compared to when it is not used. Measured dark current at 25 degrees C. is less than 20 picoamps with layer 14 present and is 3000 picoamps when layer 14 is absent. The corresponding figures at 70 degrees C. are 100 picoamps and 100,000 picoamps, respectively.

A 0.825 micron wavelength laser is used to provide light signal 32. The pulse width of the applied light signal 32 is 18 nanoseconds. The 10 percent to 90 percent rise and fall times of the light signal 32 is approximately 0.5 nanoseconds. With photodiode 10 having a total photosensitive area of 1.1 square millimeters and with a reverse bias applied to photodiode 10 (electrode 28 connected to a −4 volt power supply and electrode 22 connected ground potential), the 10 percent to 90 percent rise and fall times of photo-current induced in photodiode 10 are both approximately 4 nanoseconds. With 30 volts of applied reverse bias the rise and fall times are approximately two nanoseconds each. If photodiode 10 is fabricated without layer 14, then with an applied reverse bias voltage of 4 volts the rise and fall times are both greater than approximately 16 nanoseconds. With 30 volts of applied reverse bias, the rise and fall times are two nanoseconds each when there is no layer 14 present.

In many optical fiber communications, the photosensitive area of photodiode 10 can be one to two orders of magnitude smaller than the 1.1 square millimeters of the fabricated device. The overall area of the photodiode is also correspondingly reduced. This much smaller device is expected to have rise and fall times in one (1) nanosecond range.

Figure 2:
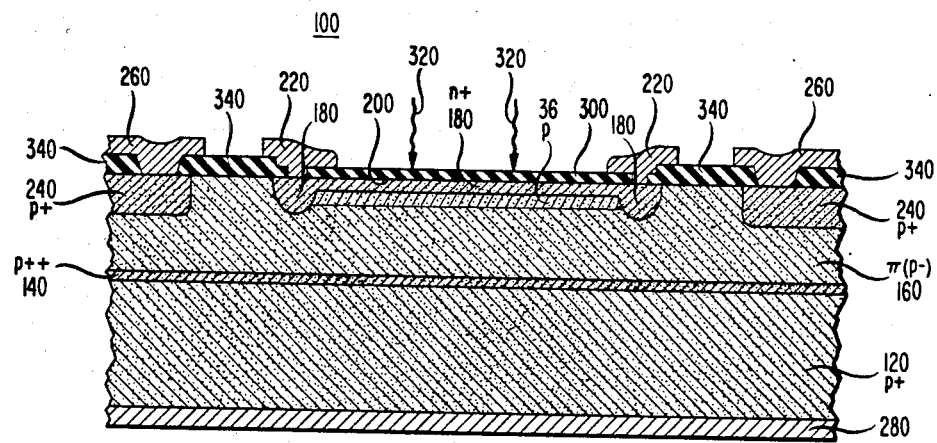
FIG. 2 is a cross-sectional view of a semiconductor photodiode structure in accordance with another embodiment of the present invention.

Referring now to FIG. 2, there is illustrated an avalanche type photodiode 100 which is very similar to photodiode 10 of FIG. 1 except that it includes an additional semiconductor region 36 which in one illustrative embodiment is of p type conductivity. All regions, layers, electrodes, surfaces and substrates of photodiode 100 which are similar to those of photodiode 10 of FIG. 1 have the same reference symbol with a "0" added at the end.

Buried layer 140 of photodiode 100 enhances the response time, significantly reduces the dark current, and allows lower reverse bias potentials in substantially the same manner as buried layer 14 of photodiode 10 of FIG. 1. Photodiode 100 is typically operated at a reverse bias near the avalanche breakdown voltage and the operating potentials can be in the 100 volt range.

It is to be understood that the above-described embodiments are merely illustrative of the many possible specific embodiments which can be devised to represent application of the principles of the invention. Numerous and varied other arrangements can be devised in accordance with these principles by those skilled in the art without departing from the spirit and scope of the invention. For example, layers 14 and 140, can be replaced by other recombination center mechanisms which also provide for recombination of minority carriers generated in substrate 12 or 120. Crystallographic defects can also act as recombination centers, especially when decorated with impurities. A high density of defects such as misfit dislocations or stacking faults at the boundary between regions 16 and 160 and substrates 12 and 120, respectively, could also serve as the desired recombination center for minority carriers. Misfit dislocations are generated by a high concentration diffusion of a dopant whose atomic radius differs from that of silicon. A germanium-doped silicon layer used between regions 16 and 160 and substrates 12 and 120, respectively, could provide the desired misfit dislocations. Still further, electrodes 28 and 280 could be coupled through p+ type deep regions (not illustrated) to electrodes making contact with top surfaces 20 and 200. Still further, a reverse bias potential can be applied in some applications to electrodes 26 and 260. Still further, electrodes 26 and 260 can be directly connected to electrodes 28 and 280, respectively. Still further, regions 18, 24, 18 and 240 can be circular. Still further, photodiodes utilizing the present invention can be fabricated with materials such as Ge, compound III-V, and ternary and quaternary materials and heterojunctions. Still further, the guard rings can actually come in contact with the cathode regions. Still further, the thickness of the epitaxial layers can be varied to accommodate different light wavelengths and different materials.

What is claimed is:

1. In a semiconductor photodiode having in combination a semiconductor body of a first conductivity type and being of a first impurity concentration, said semiconductor body having a predetermined thickness, a first semiconductor layer of said first conductivity type and of a second impurity concentration less than said first impurity concentration, a localized first semiconductor region of a second, opposite conductivity type and of a third impurity concentration substantially equal to said first impurity concentration, said first localized region being of a predetermined thickness, the combination forming a photosensitive semiconductor junction, CHARACTERIZED BY:
   a second semiconductor layer of the first conductivity type and of a fourth impurity concentration greater than the first impurity concentration of the semiconductor body,
   the second semiconductor layer being disposed between the first semiconductor layer and the semiconductor body.

2. The semiconductor photodiode of claim 1 further characterized by:
   a first electrode coupled to a portion of the first semiconductor region; and
   a second electrode coupled to a portion of the semiconductor body.

3. The semiconductor photodiode of claim 2 further characterized by an anti-reflective coating lying on one surface of the first semiconductor region.

4. The semiconductor photodiode of claim 3 further characterized by:
   a second localized semiconductor region of the first conductivity type and of a fifth impurity concentration substantially equal to the first impurity concentration
   of the semiconductor body, said second localized semiconductor region being of a predetermined thickness and disposed such that said second localized semiconductor region encircles the first localized semiconductor region.

5. The semiconductor photodiode of claim 4 further characterized by the impurity concentration of the second semiconductor layer being approximately one order of magnitude or greater than the impurity concentration of the semiconductor body.

6. The semiconductor photodiode of claim 5 further characterized by the predetermined thickness of the first semiconductor layer being greater than the predetermined thickness of the second semiconductor layer.

7. The semiconductor photodiode of claim 6 further characterized by the predetermined thickness of the semiconductor body being greater than the predetermined thickness of the first semiconductor layer.

8. The semiconductor photodiode of claim 7 further characterized by the semiconductor body, the first semiconductor layer, the second semiconductor layer, the first localized semiconductor region, and the second localized semiconductor region being of p+, p−, p++, n+ and p+ type conductivity, respectively.

9. The semiconductor photodiode of claim 8 further characterized by the anti-reflective coating being silicon nitride.

10. The semiconductor photodiode of claim 8 further characterized by the photodiode being adapted to detect light incident thereupon which has a wavelength in the range of 0.8 to 0.9 microns.

11. The semiconductor photodiode of claim 7 further characterized by the semiconductor body, the first semiconductor layer, the first localized semiconductor region, and the second localized semiconductor region being of n+, n−, n++, p+, and n+ type conductivity, respectively.

12. The semiconductor photodiode of claim 7 further characterized by:
   a localized third semiconductor region of the first conductivity type and having a fifth impurity concentration which is greater than the second impurity concentration of the first semiconductor layer; and
   the third semiconductor region being located essentially below a lower surface of the first localized semiconductor region and being separated from the second semiconductor layer by portions of the first semiconductor layer.

13. The semiconductor photodiode of claim 12 further characterized by the semiconductor body, the first semiconductor layer, the second semiconductor layer, the localized first semiconductor region, the localized second semiconductor region, and the localized third semiconductor region being of p+, p−, p++, n+, p+ and p type conductivity, respectively.

14. The semiconductor photodiode of claim 12 further characterized by the semiconductor body, the first semiconductor layer, the second semiconductor layer, the localized first semiconductor region, the localized second semiconductor region, and the localized third semiconductor region being of n+, n−, n++, p+, n+ and n type conductivity, respectively.

15. The semiconductor photodiode of claim 7 further characterized by the first layer being an epitaxial layer formed over the second semiconductor layer.

* * * * *